US009219040B2

(12) United States Patent
Mann et al.

(10) Patent No.: US 9,219,040 B2
(45) Date of Patent: Dec. 22, 2015

(54) INTEGRATED CIRCUIT WITH SEMICONDUCTOR FIN FUSE

(71) Applicant: GLOBALFOUNDRIES, Inc., Grand Cayman, KY (US)

(72) Inventors: Randy W. Mann, Milton, NY (US); Kingsuk Maitra, Guilderland, NY (US); Anurag Mittal, Wappingers Falls, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 50 days.

(21) Appl. No.: 14/032,484

(22) Filed: Sep. 20, 2013

(65) Prior Publication Data
US 2014/0021579 A1 Jan. 23, 2014

Related U.S. Application Data

(62) Division of application No. 13/171,228, filed on Jun. 28, 2011, now Pat. No. 8,569,116.

(51) Int. Cl.
*H01L 23/525* (2006.01)
*H01L 23/62* (2006.01)

(52) U.S. Cl.
CPC ............ *H01L 23/62* (2013.01); *H01L 23/5256* (2013.01); *H01L 2924/0002* (2013.01)

(58) Field of Classification Search
CPC .. H01L 23/5256; H01L 23/5258; H01L 23/62
See application file for complete search history.

(56) References Cited

U.S. PATENT DOCUMENTS

| 5,420,456 | A | 5/1995 | Galbi et al. | |
|---|---|---|---|---|
| 5,608,257 | A * | 3/1997 | Lee et al. | 257/529 |
| 6,337,507 | B1 | 1/2002 | Bohr et al. | |
| 6,420,217 | B1 | 7/2002 | Kalnitsky et al. | |
| 6,933,591 | B1 * | 8/2005 | Sidhu et al. | 257/665 |
| 7,153,712 | B1 | 12/2006 | Sidhu et al. | |
| 8,030,736 | B2 | 10/2011 | Booth et al. | |
| 2005/0258505 | A1 | 11/2005 | Wu et al. | |
| 2006/0128072 | A1 * | 6/2006 | Rajagopalan et al. | 438/131 |
| 2006/0278953 | A1 * | 12/2006 | Shimizu | 257/529 |
| 2007/0029576 | A1 * | 2/2007 | Nowak et al. | 257/209 |
| 2007/0082431 | A1 | 4/2007 | Hoefler et al. | |
| 2007/0246796 | A1 * | 10/2007 | Guo et al. | 257/529 |
| 2008/0093704 | A1 * | 4/2008 | Park et al. | 257/529 |

(Continued)

OTHER PUBLICATIONS

State Intellectual Property Office of the People's Republic of China, First Office Action for Chinese Patent Application No. 201210209628.3, mailed Jan. 30, 2014.
The Intellectual Property Office, Examination Report for Taiwanese Patent Application No. 101120433 mailed May 21, 2014.

(Continued)

*Primary Examiner* — Kevin Parendo
(74) *Attorney, Agent, or Firm* — Ingrassia Fisher & Lorenz, P.C.

(57) ABSTRACT

Methods of fabricating an integrated circuit with a fin-based fuse, and the resulting integrated circuit with a fin-based fuse are provided. In the method, a fin is created from a layer of semiconductor material and has a first end and a second end. The method provides for forming a conductive path on the fin from its first end to its second end. The conductive path is electrically connected to a programming device that is capable of selectively directing a programming current through the conductive path to cause a structural change in the conductive path to increase resistance across the conductive path.

13 Claims, 6 Drawing Sheets

(56) References Cited

U.S. PATENT DOCUMENTS

| | | | |
|---|---|---|---|
| 2008/0157201 A1* | 7/2008 | Marshall | 257/350 |
| 2009/0057819 A1 | 3/2009 | Shin et al. | |
| 2009/0140382 A1 | 6/2009 | Gao et al. | |
| 2009/0206446 A1* | 8/2009 | Russ et al. | 257/529 |
| 2010/0107403 A1* | 5/2010 | Aubel et al. | 29/623 |
| 2011/0001212 A1* | 1/2011 | Kim | 257/529 |
| 2011/0031582 A1* | 2/2011 | Booth et al. | 257/530 |
| 2012/0187528 A1 | 7/2012 | Cheng et al. | |
| 2012/0187529 A1 | 7/2012 | Maciejewski et al. | |

OTHER PUBLICATIONS

State Intellectual Property Office of the Peoples' Republic of China, Notification of Allowance and Notification of Registration for Chinese Patent Application No. 201210209628.3, mailed Sep. 23, 2014.

U.S. Office Action mailed Mar. 18, 2013 in U.S. Appl. No. 13/171,228.

Notice of Allowance mailed Jun. 25, 2013 in U.S. Appl. No. 13/171,228.

Intellectual Property Office, Decision Letter for Taiwanese Patent Application No. 101120433 mailed Jun. 3, 2015.

* cited by examiner

INTEGRATED CIRCUIT WITH SEMICONDUCTOR FIN FUSE

CROSS-REFERENCE TO RELATED APPLICATION

This is a divisional application of U.S. patent application Ser. No. 13/171,228, filed Jun. 28, 2011.

TECHNICAL FIELD

Embodiments of the subject matter described herein relate generally to semiconductor devices. More particularly, embodiments of the subject matter relate to integrated circuits that include fin-based fuses and methods for fabrication thereof.

BACKGROUND

The prior art is replete with semiconductor devices and circuits that have selectable, switchable, and/or configurable operating states, features, devices, or elements. In many implementations, different components or circuit elements can be inserted or removed as necessary using one-time programmable (OTP) fuses. For example, OTP fuses are typically used to implement cache redundancy in SRAM devices. Such OTP fuses can be used to remove a bad column or row of memory cells and to replace the bad memory cells with a redundant column or row.

The main purpose of an OTP fuse device is to act as a conductive pathway until it is "blown". Historically, integrated fuse devices have involved patterned metal conductive links that can be selectively "blown" or cut with a laser beam or by passing a large current through them. This process causes a portion of the link material to vaporize and a portion to melt, in much the same manner as an automotive fuse, but on a much smaller scale. Once blown, the fuse changes from a highly conductive state to a highly resistive (i.e., non-conductive) state, because the blown fuse inhibits current from flowing through and represents an open circuit to the current path.

Current semiconductor technology utilizes e-fuses made of polysilicon or metals and programmed by rupturing the conductor links. In addition to strict requirements for surrounding passivation and metals, these e-fuses are relatively large and exhibit unacceptable reliability because debris and shards can cause healing which re-closes the conductive pathway. Further, most e-fuses have high power requirements for programming.

Because the current necessary to blow a currently used fuse is significantly large, the destruction of the link material can cause collateral damage to nearby devices on the circuit. Further, due to the size of the current necessary to blow the fuse, typical semiconductor devices must provide a large amount of space for the inclusion of a relatively large current generator.

Accordingly, it is desirable to provide an integrated circuit with a fuse and method of fabricating an integrated circuit with a fuse that reduces the current required for programming, and that reduces the required size of the current source. Also, it desirable to provide a method of fabricating a fuse that employs existing procedures for the fabrication of other semiconductor device elements. Furthermore, other desirable features and characteristics of the present invention will become apparent from the subsequent detailed description of the invention and the appended claims, taken in conjunction with the accompanying drawings and this background of the invention.

BRIEF SUMMARY

A method of fabricating an integrated circuit with a fin-based fuse in accordance with one embodiment provides for the creation of a fin from a layer of semiconductor material. The fin includes a first end and a second end. The method provides for forming a conductive path on the fin from the first end to the second end, and for electrically connecting the conductive path to a programming device that is capable of selectively directing a programming current through the conductive path to cause a structural change in the conductive path to increase resistance across the conductive path.

In another embodiment, a method of fabricating an integrated circuit with a fin-based fuse includes creating a plurality of fins from a layer of semiconductor material having high resistivity. In this embodiment, each fin has a first end, a central portion, and a second end. Further, the first end of each fin, the second end of each fin, and the central portion of a selected fin are masked to define a plurality of unmasked central portions. Then, the unmasked central portions are etched. Thereafter, a conductive path is formed on the selected fin from its first end to its second end. The conductive path is electrically connected to a programming device that is capable of selectively directing a programming current through the conductive path to cause a structural change in the conductive path to increase resistance across the conductive path.

An integrated circuit with a fin-based fuse is also provided. The fuse comprises an intrinsic semiconductor fin having a first end and a second end and a width of less than about ten nanometers (10 nm). Further, the fuse includes a conductive path formed by a metal silicide and extending from the first end of the fin to the second end of the fin. The exemplary embodiment includes a plurality of first end fin portions adjacent the first end of the fin. The metal silicide covers and electrically connects the first end portions to the conductive path on the first end of the fin. Further, there is a plurality of second end fin portions adjacent the second end of the fin, and the metal silicide covers and electrically connects the second end portions to the conductive path on the second end of the fin. A first conductive bar is provided on the conductive path over the first ends, and a second conductive bar is provided on the conductive path over the second ends. Further, at least one first conductive plug is contacted to the first conductive bar, and at least one second conductive plug is contacted to the second conductive bar. Also, the fuse is provided with a first metal layer that is connected to the first conductive plug. A programming device is electrically connected to the first metal layer and is configured to selectively direct a programming current through the conductive path. Further, the programming current causes a structural change in the metal silicide on the fin to increase resistance across the conductive path. Also, the fuse includes a second metal layer grounding the second conductive plug.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following For the sake of brevity, conventional techniques related to semiconductor device fabrication may not be described in detail herein. In particular, various steps in the manufacture of semiconductor based transistors are well known and so, in the interest of brevity, many conventional steps will only be mentioned briefly herein or will be omitted entirely without providing the well known process details. Moreover, the various tasks and process steps described herein may be incorporated into a more comprehensive procedure or process having additional steps or functionality not described in detail herein. Further, it is noted that the drawings are not drawn to scale.

An integrated circuit having a fin-based fuse and methods for fabricating an integrated circuit with a fin-based fuse are provided herein. An exemplary fabrication method leverages existing technologies in order to create a conductive path having an extremely narrow width that is susceptible to being blown with a relatively low electrical current. Specifically, the fabrication method utilizes existing techniques for forming fins having widths of only about ten nanometers (10 nm). The method then forms a conductive path across a selected fin. Depending on the selected formation process, the conductive path may comprise a metal silicide and have a width of about 10 nanometers (10 nm) to about fifty nanometers (50 nm). Because the fin itself has high resistivity, a current directed to the conductive path must pass through the thin metal silicide, resulting in agglomeration of the silicide material and opening of the conductive path. As a result, a relatively small current is able to blow the fin-based fuse.

In addition to the reduction of current, the methods of fabrication herein provide for creating the fuse during front end of line (FEOL) processing. As a result, the methods exhibit improved precision and tolerances over back end of line (BEOL) fuse fabrication. Further, the methods provide for improved fuse layout area.

Figure 1:
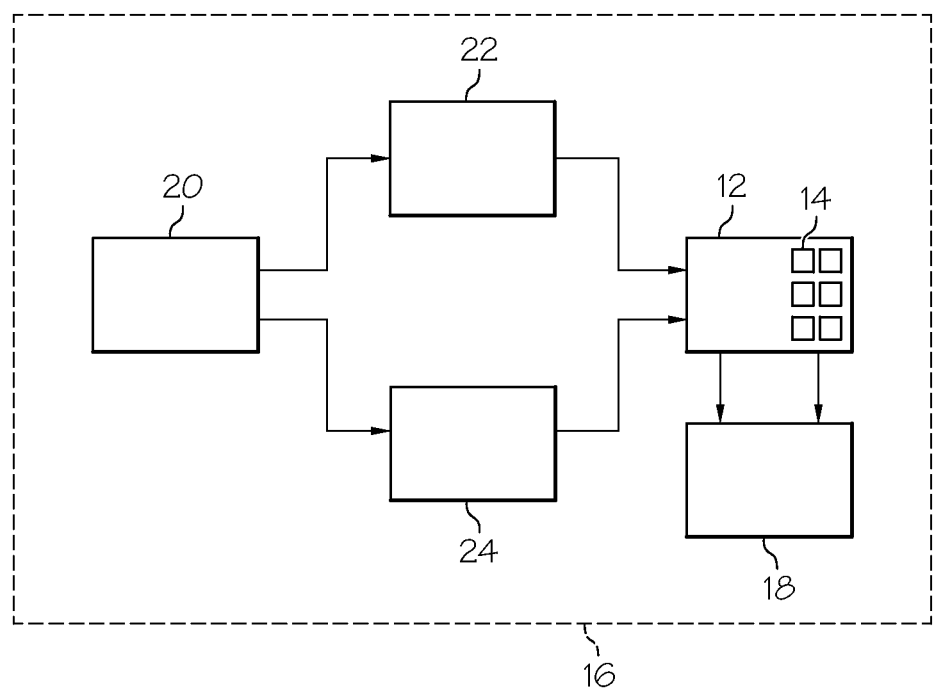
FIG. 1 is a schematic block diagram representation of a semiconductor device that includes a fin-based fuse array.

Referring to FIG. 1, a schematic block diagram representation shows a semiconductor device or integrated circuit 10 that includes an array 12 of fin-based fuses 14 fabricated on a semiconductor substrate 16 according to the methods discussed below. Notably, at least one other circuit, device, component, or feature 18 is also formed on semiconductor substrate 16. In preferred embodiments, for example, at least one transistor-based device (e.g., one or more NFET devices and/or one or more PFET devices) are formed on common semiconductor substrate 16.

Integrated circuit 10 also includes a programming device 20, a voltage generator 22, and a fuse selection and control element 24. As shown in FIG. 1, these components may also be formed on semiconductor substrate 16. Programming device 20 is suitably configured to selectively program the fin-based fuses 14 in array 12 to operate in either a high-resistance/low-current state or a low-resistance/high-current state. In this regard, programming device 20 may include or cooperate with voltage generator 22 and/or with fuse selection and control element 24 in the manner described in more detail below. It should be appreciated that FIG. 1 depicts an overly simplified representation of an exemplary embodiment, and that an actual deployment may include conventional elements, logic, components, and functionality not shown in FIG. 1.

Notably, the fin-based fuses 14 in array 12, transistor-based devices 18, programming device 20, voltage generator 22, and control element 24 are fabricated using the same well-known semiconductor fabrication techniques and process technology. In other words, the same transistor technology and manufacturing technique is utilized to create the fin-based fuses, the operating transistors and programming components of integrated circuit 10, including conventional photolithography, etching, cleaning, material deposition, material growth, ion implantation, and polishing steps. Moreover, the fin-based fuses, operating transistors and programming components can be concurrently fabricated during the same manufacturing process. Thus, array 12 can be efficiently formed by leveraging the same fabrication process used for the other transistor-based devices 18 and programming components 20, 22, 24.

In the exemplary embodiment, semiconductor substrate 16 has a layer of semiconductor material that is used to form transistor devices and fin-based fuses. Semiconductor substrate 16 may be a silicon-on-insulator (SOI) substrate or a bulk silicon substrate, although other semiconductor materials could be used. For the fin-based fuses 14, the semiconductor material has very high resistivity and is typically very lightly doped or intrinsic silicon, though other portions may be subsequently doped in an appropriate manner to form active regions for devices 18.

As represented in FIG. 1, array 12 preferably includes a plurality of programmable fin-based fuses 14 fabricated according to the methods discussed below. In practice, the fin-based fuses are OTP fuses, i.e., they are only programmed one time. Accordingly, programming device 20 and fuse selection and control element 24 are suitably configured to facilitate the selection of fin-based fuses 14 in array 12 for programming In practical embodiments, the system may leverage known addressing and switching techniques to select a desired target fuse 14 (or a plurality of target fuses 14) in array 12 for programming into one of two states: a low-resistance/high-current state; or a high-resistance/low-current state.

Figure 2:
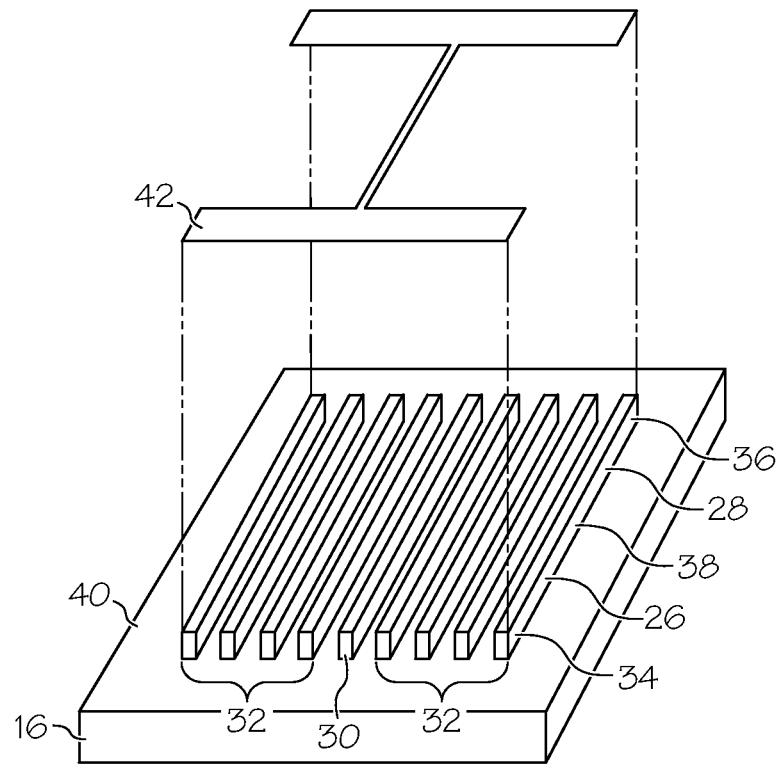
FIG. 2 is a perspective view of a semiconductor material during formation of a fin-based fuse used in the array of FIG. 1.

Referring now to FIG. 2, the fabrication of integrated circuit 10 including a fin-based fuse 14 is discussed. FIG. 2 shows the result of an initial step in the fabrication of a fin-based fuse 14. Specifically, in FIG. 2 a plurality of fins 26 have been created from a layer of semiconductor material 28. As shown, the plurality of fins 26 includes a primary fin 30 and a plurality of adjacent fins 32. Further, each of the fins 26 has an end 34, an end 36, and a central portion 38 therebetween. In the exemplary embodiment, the layer of semiconductor material 28 from which the fins 26 are formed is the top silicon layer from an SOI substrate 16. For such an embodiment, the removal of the top silicon layer 28 around the fins 26 results in exposing portions of a buried oxide layer 40, such as silicon dioxide. The creation of the fins 26 may be performed by masking and etching the top silicon layer 28. In an exemplary embodiment, each fin 26 has a height of thirty nanometers (30 nm) and a width of ten nanometers (10 nm), and is separated from each proximate fin 26 by a distance of thirty nanometers (30 nm).

Figure 3:
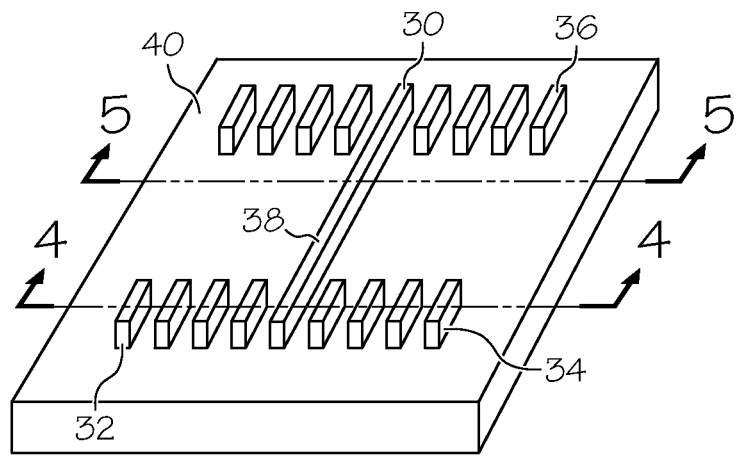
FIG. 3 is a perspective view of the semiconductor material of FIG. 2, after further processing to create the fin-based fuse used in the array of FIG. 1.

After the plurality of fins 26 is prepared, further processing is performed. Specifically, the central portions 38 of the adjacent fins 32 are removed. In the embodiment illustrated in FIG. 2, a mask 42 or masks may be used to cover the ends 34 and 36 of the fins 26, as well as the central portion 38 of the primary fin 30. After the mask 42 is applied to the fins 26, the uncovered central portions 38 of the adjacent fins 32 are etched and removed. Referring to FIG. 3, it can be seen that the central portions 38 of the adjacent fins 32 have been removed. As a result, the ends 34 and the ends 36 of the adjacent fins 32 and the intact primary fin 30 remain for further processing. In the exemplary embodiment shown, the central portions 38 of the adjacent fins 32 have been removed via a mask and etch process.

Figure 4:
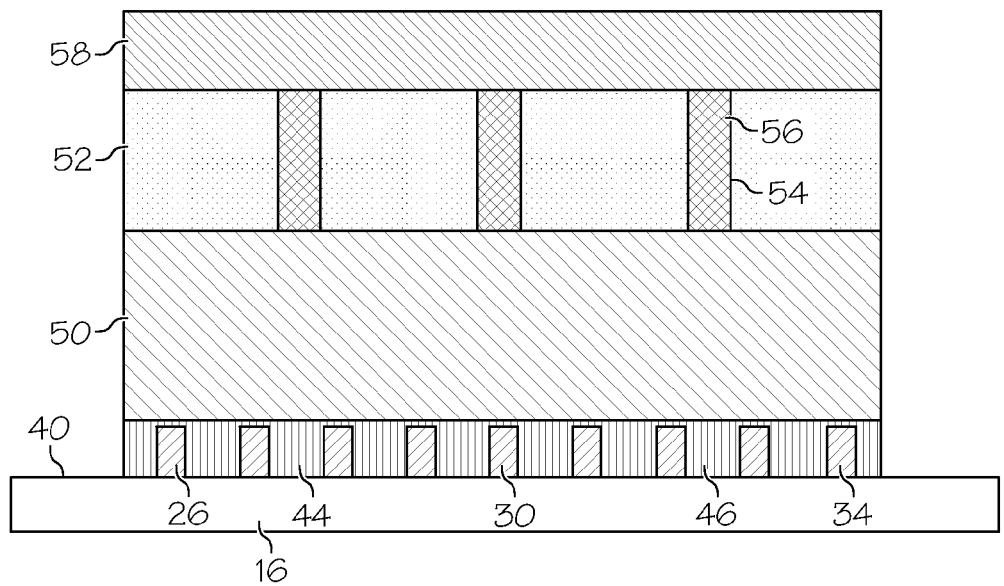
FIG. 4 is a cross-sectional view taken along line 4-4 in FIG. 3 to illustrate further processing at the ends of the fins during fabrication of the fin-based fuse used in the array of FIG. 1.

With the creation of the fin structure (comprising the primary fin 30 and the ends 34 and 36 of the adjacent fins 32) complete, further processing of the ends 34 and 36 is discussed in relation to FIG. 4, which is a cross-sectional view taken generally along line 4-4 in FIG. 3 after later processing steps. It is noted that while FIG. 4 illustrates ends 34, it is understood that ends 36 will undergo the same processing steps. Processing of the central portion 38 of the primary fin 30 is discussed in relation to FIG. 5, which is a cross-sectional view taken generally along line 5-5 in FIG. 3 after later processing.

Figure 5:
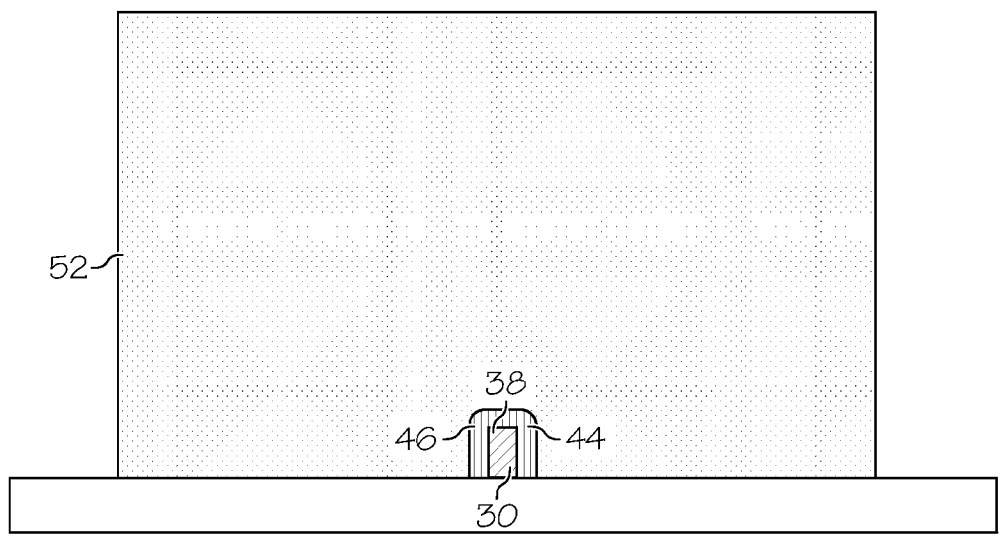
FIG. 5 is a cross-sectional view taken along line 5-5 in FIG. 3 to illustrate further processing at the central portion of the primary fin during fabrication of the fin-based fuse used in the array of FIG. 1

Although other fabrication steps or sub-processes may be performed, the exemplary method shown in FIGS. 4 and 5 continues by forming a conductive path 44 from the ends 34, across the primary fin 30, to the ends 36 (not shown). In the exemplary embodiment shown in FIGS. 4 and 5, it can be seen that the conductive path 44 is formed by a metal silicide 46 that merges the ends 34 (and ends 36).

Figure 6:
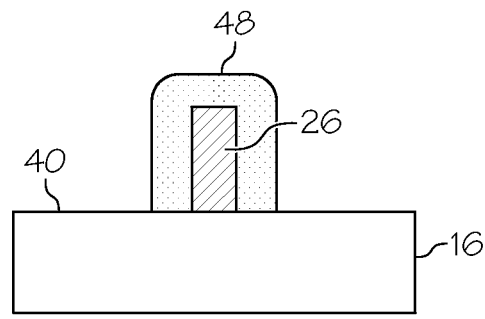
FIG. 6 is a cross-sectional view of a fin illustrating an embodiment of fabrication of the fin-based fuse used in the array of FIG. 1.

Referring to FIG. 6, the metal silicide 46 on a fin 26 (whether the primary fin 30, or an end 34 or 36) may be produced by first depositing an epitaxial layer 48 on the fins 26. Specifically, the epitaxial layer 48 forms isotropically to a height and width, in accordance with one embodiment, of about fifteen to twenty nanometers (15-20 nm). At the ends 34 and 36, which are distanced thirty nanometers (30 nm) apart, this epitaxial growth results in proximate fins 26 becoming merged as shown in FIG. 4. Depending on the desired result, the method of depositing the epitaxial layer 48 may result in undoped, P-doped, N-doped, or partially P-doped and partially N-doped silicon.

After the epitaxial layer 48 is deposited, the appropriate salicide process is performed to create the metal silicide 46 as shown in FIGS. 4 and 5. For example, a layer of silicide-forming metal (not shown) is deposited onto the surfaces of the fins 26. The silicide-forming metal can be deposited, for example, by sputtering to a thickness of about five to fifty nanometers (5-50 nm), and preferably to a thickness of about twenty nanometers (20 nm). The fin structure is then heated, for example, by rapid thermal annealing, to form the metal silicide 46. The silicide-forming metal can be, for example, cobalt, nickel, rhenium, ruthenium, or palladium, or alloy thereof. Any silicide-forming metal that is not in contact with exposed silicon (i.e., the metal on the oxide layer 40) does not react during heating and, therefore, does not form a silicide. This excess metal may be removed by wet etching or any suitable procedure. During the salicide process, the epitaxial layer 48 is consumed by the silicide formation.

Figure 7:
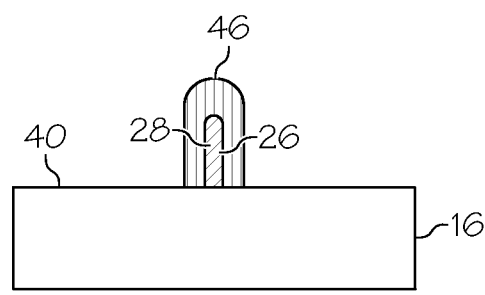
FIG. 7 is a cross-sectional view of a fin illustrating an embodiment of fabrication of the fin-based fuse used in the array of FIG. 1.

In certain embodiments, the metal silicide 46 may be produced without the intermediate formation of the epitaxial layer 48. If such a process is performed on the ends 34 and 36, they will not be merged. As shown in FIG. 7, the salicide process has been performed directly on the silicon layer 28 forming the fin 26. In FIG. 7, the salicide process has consumed a portion of the silicon layer 28 forming the fin 26. In view of this result, it can be seen how the ends 34 and 36 would not be merged if an epitaxial layer 48 is not deposited. Further, FIG. 7 shows how the ratio of metal silicide 46 to silicon 28 in the fin 26 may be controlled through the salicide process and through the non-use, or use and selected thickness, of an epitaxial layer 48.

Further, the epitaxial layer 48 may be selectively deposited. For instance, in certain embodiments the epitaxial layer 48 may be deposited only on the ends 34 and 36 of the fins, before the ends 34 and 36 of the fins 26 and the central portion 38 of the primary fin 30 are salicided. For such embodiments, the merged ends 34 and 36 would have an increased current-carrying capacity, while the conductive path 44 on the central portion 38 of the primary fin 30 is at its thinnest, about ten nanometers (10 nm), and has a reduced current-carrying capacity.

In other embodiments, an epitaxial layer 48 may be deposited on the ends 34 and 36 of the fins 26 and on the central portion of the primary fin 30. For such embodiments, the current-carrying capacity of the ends 34 and 36 is increased and the current-carrying capacity of the conductive path 44 on the central portion 38 of the primary fin 30 is increased, though still substantially less than that of the ends 34 and 36. Alternatively, an epitaxial layer 48 may be formed only on the central portion 38 of the primary fin 30 before the ends 34 and 36 of the fins 26 and the central portion 38 of the primary fin 30 are salicided. As stated above, in such embodiments the ends 34 and 36 would not be merged and the conductive path at the end 34 and end 36 of the primary fin 30 may have a current-carrying capacity that is less than that of the conductive path 44 on the central portion 38 of the primary fin 30.

In any event, a conductive path 44 of desired design is formed across the primary fin 30 from the ends 34 to the ends 36. Although other fabrication steps or sub-processes may be performed next, this example proceeds with the addition of conductive bars 50 at the ends 34 and 36. Referring to FIG. 4, it can be seen that a conductive bar 50 is positioned on, and electrically connected to, the conductive path 44 over the ends 34. Likewise, a conductive bar 50 is positioned on the conductive path 44 over the ends 36 (not shown). In the exemplary embodiment, each conductive bar 50 is tungsten and has a height of about five-hundred nanometers (500 nm). Referring to FIG. 5, it can be seen that no conductive bar is positioned on the central portion 38 of the primary fin 30.

While other fabrication steps or sub-processes may be performed next, in the exemplary embodiment of FIGS. 4 and 5 a dielectric material 52 is formed over the conductive bars 50 on the ends 34 and 36 and over the metal silicide 46 across the central portion 38 of the primary fin 30. In the exemplary embodiment, the dielectric material 52 has a height of about one-hundred fifty nanometers (150 nm) over the conductive bars 50 (and about six-hundred fifty nanometers (650 nm) over the silicide 46 on the central portion 38 of the primary fin 30). In order to provide electrical connection to the conductive path 44, vias 54 are formed in the dielectric material 52. Specifically, as shown in FIG. 4, at least one via 54 is formed by etching the dielectric material 52 above each conductive bar 50. Then, each via 54 is filled with a conductive plug 56. In the exemplary embodiment, each conductive plug 56 is tungsten and has a height of about one-hundred fifty nanometers (150 nm). After the conductive plugs 56 are formed, a metal layer 58 is created and positioned in selective electrical contact with conductive plugs 56. As shown in FIG. 4, the metal layer 58 has a height of about eighty nanometers (80 nm).

Figure 8:
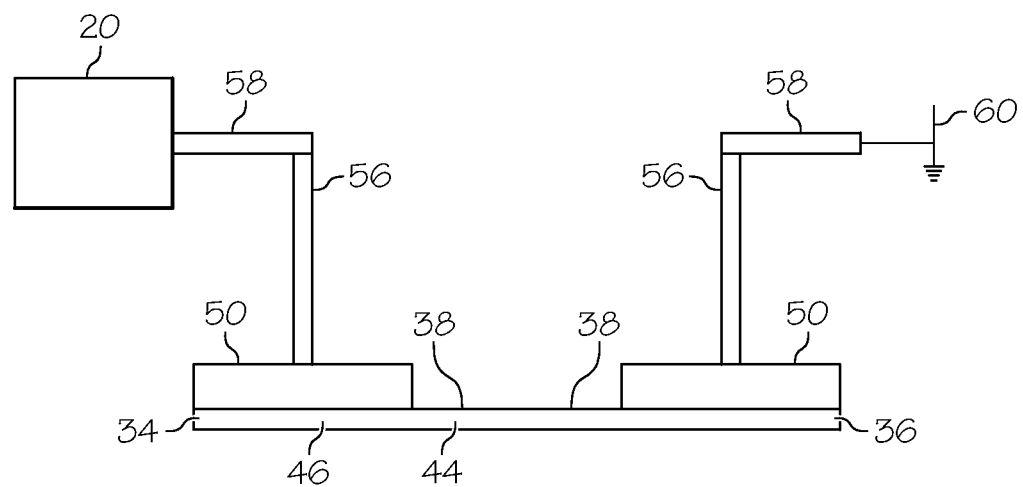
FIG. 8 is a schematic block diagram representation of the electrical connection of a fin-based fuse and a programming device.

Referring to FIG. 8, it can be seen that the metal layer 58 over the ends 34 is electrically connected to a programming device 20. Further, the metal layer 58 over the ends 36 is electrically connected to a ground 60. As a result, it can be seen that an electrical path is formed from the programming device 20, through the metal layer 58, the conductive plugs 56, the conductive bar 50, the metal silicide 46 at the ends 34, across the metal silicide 46 on the central portion 38 of the primary fin 30, through the metal silicide 46 at the ends 36, through the conductive bar 50, through the conductive plugs 56, through the metal layer 58, and to the ground 60.

Figure 9:
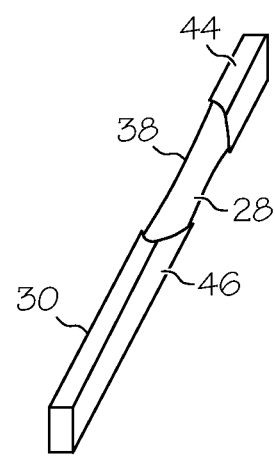
FIGS. 9-10 are perspective views of the primary fin of a fin-based fuse after the fuse is blown by a programming current.
Figure 10:
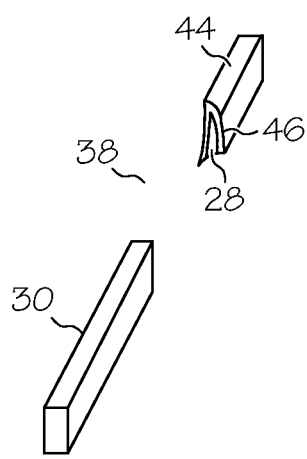

As a result of this arrangement, the programming device 20, which is configured to selectively direct a programming current to the conductive path 44, is able to cause a structural change in the conductive path 44 across the primary fin 30. Specifically, the programming device 20 can emit a current of less than about ten milliamps (10 mA) or, in certain embodiments, less than about one milliamp (1 mA), that is sufficient to cause the metal silicide 46 on the central portion 38 of the primary fin 30 to agglomerate and pull away from itself, as shown in FIG. 9. As a result, the conductive path 44 is opened and resistance across the conductive path 44 is increased significantly, e.g., to over one megaOhm (1 MOhm). Further, in the exemplary embodiment shown in FIG. 10, the programming current causes the destruction or consumption of the silicon material 28 of the central portion 38 of the primary fin 30 in addition to the physical change in the metal silicide 46.

Referring back to FIG. 1, the programming device 20 may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. In this regard, a processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration.

Semiconductor device 10 may include or cooperate with voltage generator 22, which is coupled to array 12. Voltage generator 22 can be controlled by programming device 20. Voltage generator 22 is suitably configured to generate the necessary voltages utilized in connection with programming the fin-based fuses in array 12. For example, voltage generator 22 may include or utilize one or more charge pumps, one or more voltage divider circuits, and/or one or more distinct voltage sources. Voltage generator 22 may be designed to provide any number of fixed, variable, and/or dynamically adjustable voltage signals (including ground potential). In addition, voltage generator 22 may be designed to leave a node or terminal of array 12 in a floating state, i.e., no voltage asserted.

For a given fin-based fuse 14, programming device 20 and voltage generator 22 initially produce no programming current at the conductive path 44 to achieve the low-resistance/high-current state. In order to achieve the high-resistance/low-current state, programming device 20 and voltage generator 22 direct a programming current at the conductive path 44 sufficient to physically change the metal silicide 46 forming the conductive path 44 across the central portion 38 of the primary fin 30.

Because the metal silicide 46 forming the conductive path 44 across the central portion 38 of the primary fin 30 has a small width and low current-carrying capacity, the programming current need not be large to blow the fuse at the central portion 38 of the primary fin 30. In fact, in an exemplary embodiment, the programming current sufficient to blow the fin-based fuse 14 has a positive voltage that corresponds to, or is less than, a supply voltage of the transistor-based devices with which the fin-based fuse cooperates. As a result, fuse-specific voltage sources are not necessary.

As stated above, deposition of the epitaxial layer 48 can be controlled to result in undoped, P-doped, N-doped, or partially P-doped and partially N-doped silicon. For P-doped silicon or N-doped silicon, there would be a relatively lower resistance pathway across the central portion 38 of the primary fin 30 after the fuse is blown (compared to undoped silicon). Because there must be a sufficient resistance change between the unblown fuse and the blown fuse, the use of P-doped silicon or N-doped silicon may not be ideal. However, it is envisioned that the resistance change could be optimize to provide for use of such silicon.

In the case of a primary fin 30 with partially P-doped and partially N-doped silicon, a single crystal silicon NP diode would result from blowing the fuse by agglomerating the metal silicide 46. Such a diode would limit current with a positive bias on the N+ side while allowing current to flow when biased in the opposite direction. For instance, applying a positive bias to the N− side will result in very high resistance, while applying a positive bias to the P+ side would result in low resistance as a result of the convention P/N diode structure that is left after the silicide is damaged. In the method of fabrication, the partially P-doped and partially N-doped silicon can be created by the known method of first masking half of the primary fin 30 which using a doped epitaxial process to create the N-type half Then the N-type half would be masked and the other half unmasked for P-type epitaxial growth. These steps would be performed before the salicide process.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit having a fin-based fuse comprising:
   a semiconductor fin having a first end and a second end;
   a conductive path formed by a metal silicide from the first end of the semiconductor fin to the second end of the semiconductor fin;
   first end fin portions adjacent the first end of the semiconductor fin;
   second end fin portions adjacent the second end of the semiconductor fin, wherein the metal silicide covers and electrically connects the first end fin portions to the conductive path on the first end of the semiconductor fin and covers and electrically connects the second end fin portions to the conductive path on the second end of the semiconductor fin; and
   a programming device electrically connected to the first end of the semiconductor fin and configured to selectively direct a programming current through the conductive path, wherein the programming current causes a structural change in the conductive path and consumption of the semiconductor fin to form a gap in the semiconductor fin.

2. The integrated circuit of claim 1 further comprising:
   a first conductive bar on the conductive path over the first end;
   a second conductive bar on the conductive path over the second end; and
   a first conductive plug contacted to the first conductive bar; wherein the programming device is electrically connected to the first conductive plug.

3. The integrated circuit of claim 2 further comprising a first metal layer connecting to the first conductive plug, wherein the programming device is electrically connected to the first metal layer.

4. The integrated circuit of claim 3 further comprising:
   a second conductive plug contacted to the second conductive bar; and
   a second metal layer grounding the second conductive plug.

5. The integrated circuit of claim 1 wherein the semiconductor fin has a width of less than 10 nm.

6. The integrated circuit of claim 1 wherein the semiconductor fin has a constant height and a constant width from its first end to its second end.

7. The integrated circuit of claim 1 wherein the semiconductor fin has a continuous upper surface and continuous side surfaces from its first end to its second end.

8. An integrated circuit having a fin-based fuse comprising:
   a semiconductor fin having a first end and a second end;
   a metal silicide forming a conductive path from the first end of the semiconductor fin to the second end of the semiconductor fin;
   first end fin portions adjacent the first end of the semiconductor fin, wherein the metal silicide covers and electrically connects the first end fin portions to the conductive path on the first end of the semiconductor fin; and
   a programming device electrically connected to the first end or the second end of the semiconductor fin and configured to selectively direct a programming current through the conductive path, wherein the programming current causes a structural change in the conductive path.

9. The integrated circuit of claim 8 wherein the semiconductor fin has a constant height and a constant width from its first end to its second end.

10. The integrated circuit of claim 8 wherein the semiconductor fin, each first end fin portion, and each second end fin portion have a same height.

11. The integrated circuit of claim 8 further comprising:
    second end fin portions adjacent the second end of the semiconductor fin, wherein the metal silicide covers and electrically connects the second end fin portions to the conductive path on the second end of the semiconductor fin.

12. The integrated circuit of claim 8 further comprising:
    second end fin portions adjacent the second end of the semiconductor fin, wherein each second end fin portion is aligned with and discontinuous with a respective first end fin portion.

13. The integrated circuit of claim 8 further comprising:
    second end fin portions adjacent the second end of the fin, wherein each second end fin portion is aligned with and discontinuous with a respective first end fin portion, and wherein the metal silicide covers and electrically connects the second end fin portions to the conductive path on the second end of the fin.

* * * * *